US011166392B2

(12) United States Patent
Johnsen

(10) Patent No.: US 11,166,392 B2
(45) Date of Patent: Nov. 2, 2021

(54) SPRING-TYPE LATCH FOR SECURING A NETWORKING MODULE WITHIN A SLOT OF A CHASSIS

(71) Applicant: Ciena Corporation, Hanover, MD (US)

(72) Inventor: Warren Odd Johnsen, Kanata (CA)

(73) Assignee: Ciena Corporation, Hanover, MD (US)

(*) Notice: Subject to any disclaimer, the term of this patent is extended or adjusted under 35 U.S.C. 154(b) by 91 days.

(21) Appl. No.: 16/658,202

(22) Filed: Oct. 21, 2019

(65) Prior Publication Data
US 2021/0120694 A1  Apr. 22, 2021

(51) Int. Cl.
*H05K 7/14* (2006.01)
*H05K 7/18* (2006.01)

(52) U.S. Cl.
CPC ......... *H05K 7/1405* (2013.01); *H05K 7/1409* (2013.01); *H05K 7/1427* (2013.01); *H05K 7/186* (2013.01)

(58) Field of Classification Search
CPC .. H05K 7/1405; H05K 7/1409; H05K 7/1427; H05K 7/186
See application file for complete search history.

(56) References Cited

U.S. PATENT DOCUMENTS

| | | | |
|---|---|---|---|
| 6,356,436 B1* | 3/2002 | Buican | G06F 1/181 312/216 |
| 7,542,300 B1* | 6/2009 | Lui | G06F 1/183 312/223.2 |
| 2007/0096860 A1* | 5/2007 | Foster | H01H 1/0036 337/36 |
| 2007/0100255 A1* | 5/2007 | Boecker | A61B 5/150022 600/583 |
| 2007/0189692 A1* | 8/2007 | Zimmel | G02B 6/4446 385/135 |
| 2009/0103878 A1* | 4/2009 | Zimmel | G02B 6/3897 385/135 |
| 2009/0196616 A1* | 8/2009 | Bolster | G02B 6/4455 398/79 |
| 2010/0278498 A1* | 11/2010 | Zimmel | G02B 6/2938 385/135 |
| 2011/0019964 A1* | 1/2011 | Nhep | G02B 6/3825 385/135 |
| 2012/0184989 A1* | 7/2012 | Twomey | A61B 18/1445 606/206 |
| 2012/0301096 A1* | 11/2012 | Badar | G02B 6/4455 385/134 |

(Continued)

*Primary Examiner* — Mina M Shalaby
(74) *Attorney, Agent, or Firm* — Clements Bernard Baratta; Lawrence A. Baratta, Jr.; Christopher L. Bernard

(57) ABSTRACT

Latches for securing circuit board assemblies within a slot of a telecommunications chassis are provided. In one embodiment, a latch for restricting motion of a substrate with respect to a fixed component within a slot of the telecommunications chassis is described. For example, the latch may include a mounting section allowing the latch to be mounted to the substrate. The latch may also include a cantilever section and an arc section connecting the mounting section to the cantilever section. Furthermore, the latch may include a retention component extending from a surface of the cantilever section. The retention component may be configured to restrict motion of the substrate when engaged with the fixed component within the slot.

19 Claims, 10 Drawing Sheets

(56) References Cited

U.S. PATENT DOCUMENTS

| | | | |
|---|---|---|---|
| 2013/0165012 A1* | 6/2013 | Klauber | A63H 33/08 446/91 |
| 2014/0334790 A1* | 11/2014 | Zhang | G02B 6/3897 385/134 |
| 2015/0131998 A1* | 5/2015 | Kowalczyk | H04B 10/25891 398/70 |
| 2016/0022177 A1* | 1/2016 | Shi | A61B 5/150022 606/182 |
| 2018/0210154 A1* | 7/2018 | de Jong | G02B 6/3895 |
| 2019/0378485 A1* | 12/2019 | Arefti | G06Q 20/405 |

* cited by examiner

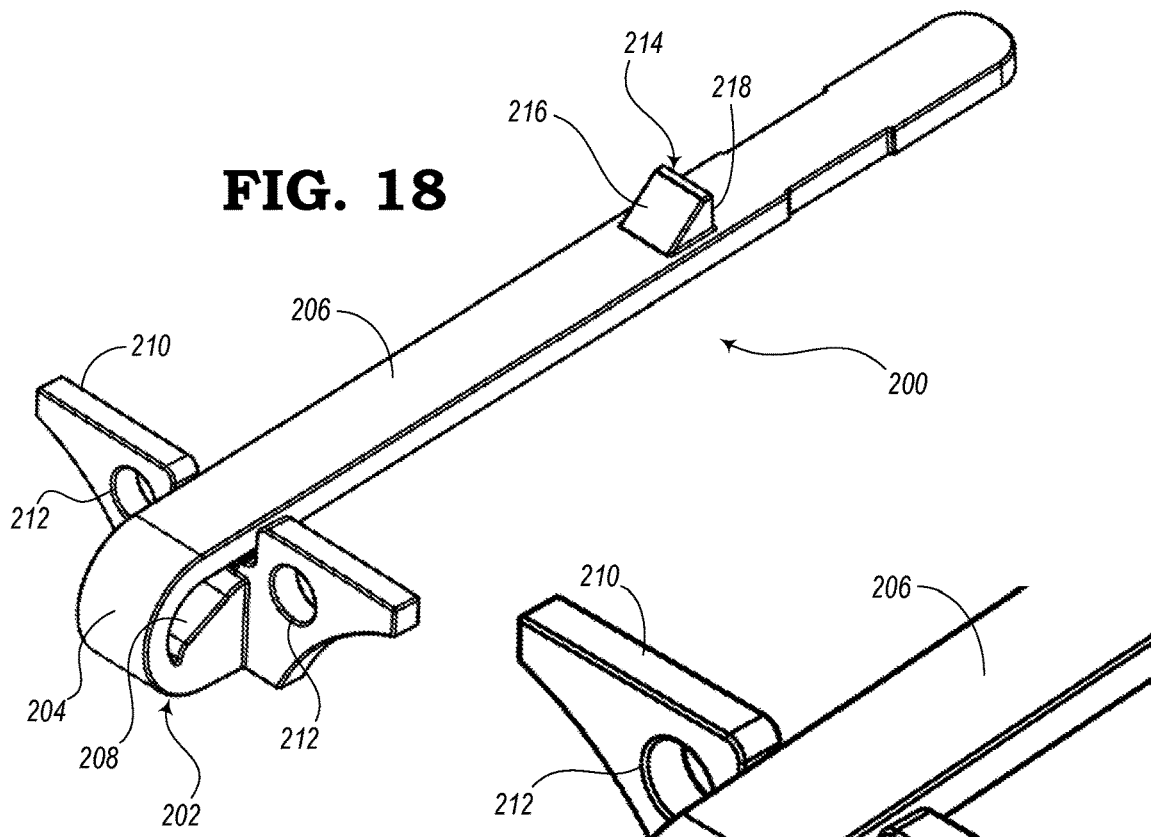
FIG. 18
FIG. 19
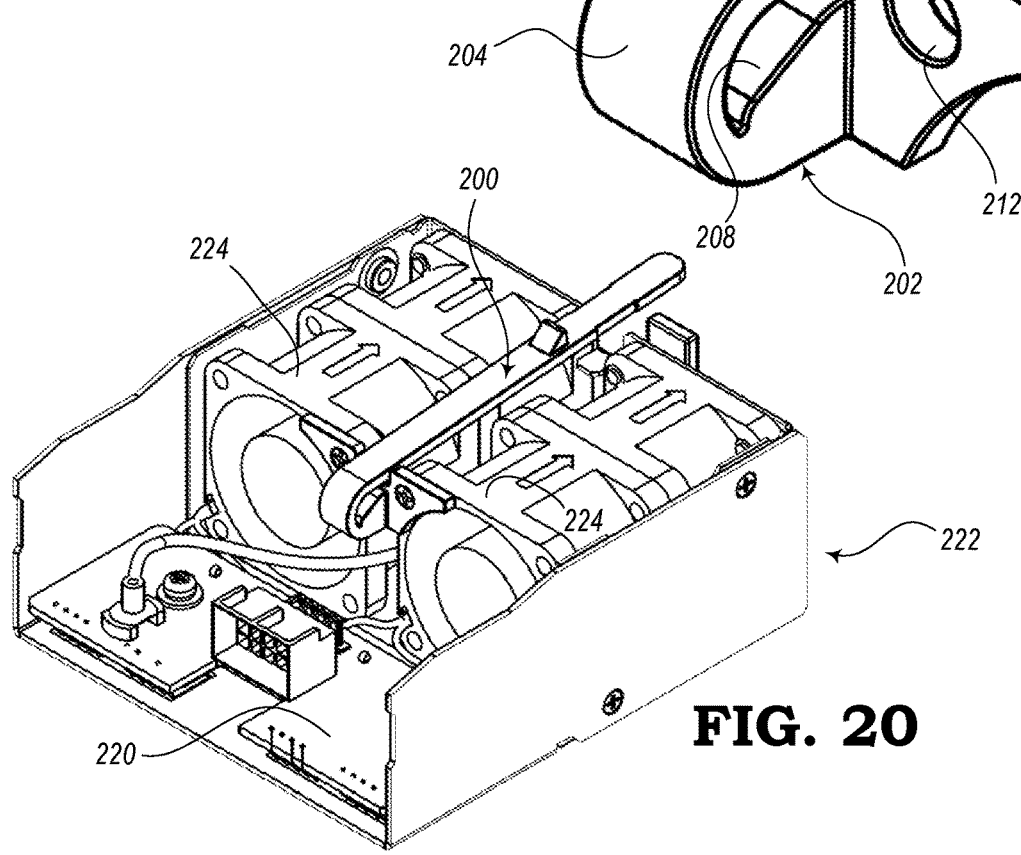
FIG. 20

SPRING-TYPE LATCH FOR SECURING A NETWORKING MODULE WITHIN A SLOT OF A CHASSIS

FIELD OF THE DISCLOSURE

The present disclosure generally relates to networking systems. More particularly, the present disclosure relates to components of a networking system and latches for securing a circuit board assembly or networking module within a slot of a chassis.

BACKGROUND OF THE DISCLOSURE

Data centers and other telecommunications network systems generally include large rack structures with chassis or shelves bolted therein for housing telecommunications equipment. Normally, each chassis may include various sizes of box-shaped slots, which may be arranged in a vertical orientation or may be arranged in a horizontal orientation. A chassis with a horizontal orientation may be referred to as a "pizza box" because of its similarity in size and shape of an actual pizza box. Circuit board assemblies (or networking modules), whether oriented vertically or horizontally, include telecommunications circuitry and are configured for insertion into the slots of the chassis.

When a circuit board assembly is installed in the chassis, a latch may be used to firmly secure the circuit board assembly within the slot, yet also allows for disengagement from the chassis as needed for replacement, repair, testing, etc.

Therefore, there is a need in the field of telecommunications systems to provide a chassis or shelf that can easily receive a circuit board assembly for securely holding the circuit board assembly while allowing the circuit board assembly to be easily removed when necessary. In particular, there is a need for a latch, which may be used in the field of telecommunications, for retaining the circuit board assemblies within a chassis or shelf. It may also be desirable to provide a latch that is durable and does not deform with use. Also, it may be desirable to provide a latch that requires fewer manufacturing steps and has lower manufacturing costs.

BRIEF SUMMARY OF THE DISCLOSURE

The present disclosure describes various embodiments of latches configured for securing circuit board assemblies or networking modules within a slot of a chassis that may be part of a telecommunications system. In one embodiment, a networking module comprises a substrate and a latch for restricting motion of the substrate with respect to a fixed component. The latch, in this embodiment, includes a mounting section configured for mounting the latch to the substrate, a cantilever section, and an arc section connecting the mounting section to the cantilever section. The latch also includes a retention component extending from a surface of the cantilever section. The retention component may be configured to restrict motion of the substrate when engaged with the fixed component.

According to another embodiment, the present disclosure describes a chassis configured to receive a circuit board assembly of a communications network. In this embodiment, the chassis includes a slot into which the circuit board assembly is configured to be inserted, where the circuit board assembly includes at least a planar substrate. The chassis further includes a fixed component arranged within the slot. A latch is connected to the planar substrate of the circuit board assembly to restrict motion of the planar substrate with respect to the fixed component. The latch includes a mounting section allowing the latch to be mounted to the planar substrate. The latch also includes a cantilever section and an arc section connecting the mounting section to the cantilever section. Also, the latch includes a retention component extending from a surface of the cantilever section, where the retention component is configured to restrict motion of the planar substrate when engaged with the fixed component.

According to yet another embodiment, a latch for securing a circuit board assembly within a slot of a telecommunications chassis is provided. The latch includes a mounting section allowing the latch to be mounted to the circuit board assembly, a cantilever section, and an arc section connecting the mounting section to the cantilever section. The latch further includes a retention component extending from a surface of the cantilever section, where the retention component is configured to restrict linear motion of the circuit board assembly when engaged with a fixed component within the slot of the telecommunications chassis.

BRIEF DESCRIPTION OF THE DRAWINGS

The present disclosure is illustrated and described herein with reference to the various drawings, in which like reference numbers are used to denote like system components/method steps, as appropriate, and in which:

FIG. 18 is a schematic diagram illustrating a perspective view of a seventh latch for removably securing a circuit board assembly within a slot of a chassis, according to various preferred embodiments of the present disclosure;

FIG. 19 is a schematic diagram illustrating a close-up perspective view of the seventh latch of FIG. 18, according to various embodiments of the present disclosure; and FIG. 20 is a schematic diagram illustrating a perspective view of the seventh latch of FIG. 18 installed on a fan housing of a circuit board assembly for removably securing the circuit board assembly within a slot of a chassis, according to various embodiments of the present disclosure.

DETAILED DESCRIPTION OF THE DISCLOSURE

Figure 1:
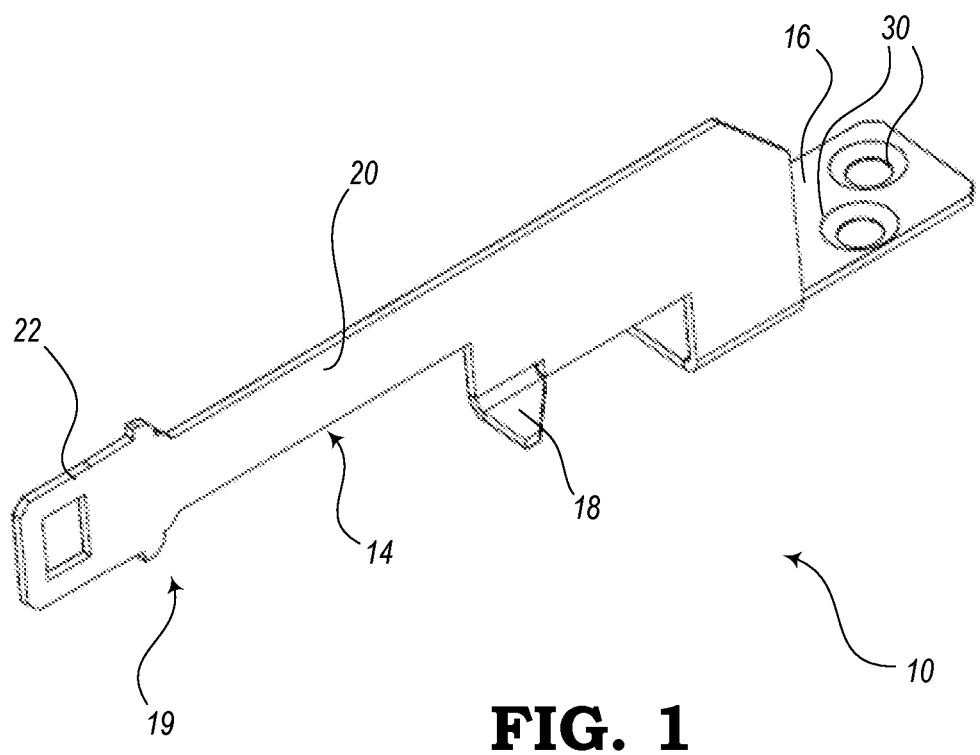
FIG. 1 is a schematic diagram illustrating a perspective view of a first latch for removably securing a circuit board assembly within a slot of a chassis, according to various embodiments of the present disclosure.

The present disclosure relates to systems and methods for securing a circuit board assembly or networking module within a slot of a chassis. For example, the circuit board assemblies described herein may include substrates or printed circuit boards (PCBs) having electrical components mounted thereon and used in a telecommunications system. The electrical components may include telecommunications components for partially or completely constructing a router, switch, server, or other telecommunications network element. The slots within the chassis may be box-shaped and may include support structures and connectors that may include parts of the chassis. One or more chassis may be bolted onto a rack of a telecommunications network system, such as a network system installed at a data center, node, or other location within a telecommunications network.

The various embodiments of latches described in the present disclosure are configured for retention purposes to retain a circuit board assembly within one of the box-shaped slots of the chassis. By inserting the circuit board assembly into a corresponding slot, the latches are configured to hold the circuit board assembly in place. The latches also include release levers for enabling a user to slide the circuit board assembly out of the slot, if necessary.

There has thus been outlined, rather broadly, the features of the present disclosure in order that the detailed description may be better understood, and in order that the present contribution to the art may be better appreciated. There are additional features of the various embodiments that will be described herein. It is to be understood that the present disclosure is not limited to the details of construction and to the arrangements of the components set forth in the following description or illustrated in the drawings. Rather, the embodiments of the present disclosure may be capable of other implementations and configurations and may be practiced or carried out in various ways. Also, it is to be understood that the phraseology and terminology employed are for the purpose of description and should not be regarded as limiting.

As such, those skilled in the art will appreciate that the inventive conception, upon which this disclosure is based, may readily be utilized as a basis for the designing of other structures, methods, and systems for carrying out the several purposes described in the present disclosure. Those skilled in the art will understand that the embodiments may include various equivalent constructions insofar as they do not depart from the spirit and scope of the present invention. Additional aspects and advantages of the present disclosure will be apparent from the following detailed description of exemplary embodiments which are illustrated in the accompanying drawings.

Figure 2:
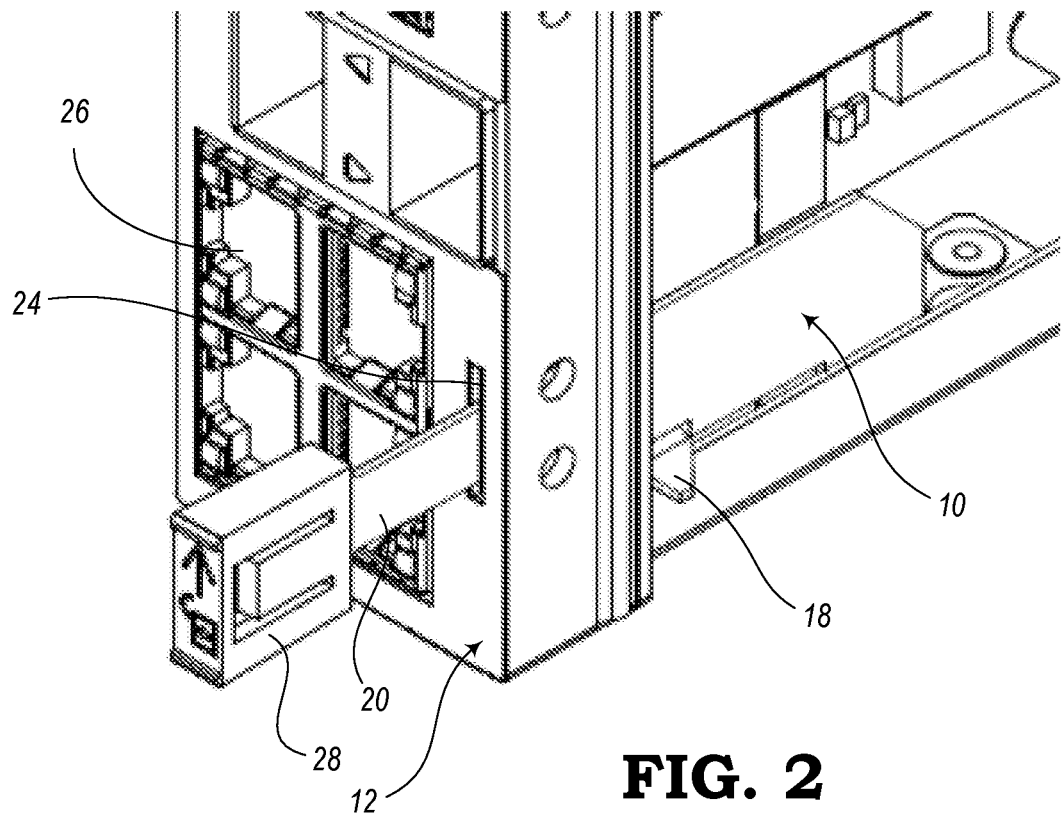
FIG. 2 is a schematic diagram illustrating a perspective view of the first latch of FIG. 1 installed on the circuit board assembly for insertion within the slot of the chassis, according to various embodiments of the present disclosure.

FIG. 1 shows a perspective view of an embodiment of a first latch 10 for removably securing a circuit board assembly within a slot of a chassis. FIG. 2 shows a perspective view of the first latch 10 connected to a circuit board assembly 12 (partially shown in FIG. 2), which is configured to be installed within a slot formed by a frame structure of a chassis (not shown). The circuit board assembly 12 may include a printed circuit board having electronic components mounted thereon and may further include various framing features to create a box-shaped construction that is intended to be installed within the box-shaped slot. The chassis may include a plurality of slots, each of which may be defined as a location or position where a circuit board assembly can be inserted. The slots may also be defined by structural components of the chassis that provide plug-in spaces or openings for the circuit board assemblies.

The printed circuit board of the circuit board assembly 12 may further include one or more electrical and/or optical connectors for connection with corresponding connectors at a back wall of the slot. The slot within which the circuit board assembly 12 is inserted may be part of a shelf or chassis, which in turn may be connected to a rack structure used for mounting various telecommunications equipment, such as routers, switches, servers, etc.

The latch 10 of FIG. 1 may include a stainless steel construction. During manufacture, a form can be cut from a sheet of metal and then pressed or stamped, according to conventional metal-working processes. Also, additional construction processes may include bending the metal, drilling or cutting holes in the metal, etc. As a result, the latch 10 having a steel cantilever beam can be constructed. A plastic cap may be constructed in a separate manufacturing process and then inserted onto an end of the metal piece. Thus, multiple manufacturing operations may be required to construct the latch 10. A latch in the environment of rack systems of telecommunications network systems might include stainless steel materials with a plastic cap for user operation. The steel and plastic are manufactured separately and then assembled together. Therefore, the materials and construction costs may be more expensive than other types of manufacturing processes, such as a process that include injection molding for creating a latch entirely of plastic.

According to this embodiment, the latch 10 may be constructed in one piece from sheet metal and then formed to obtain the shape illustrated in FIG. 1. The latch 10 may include a vertical body portion 14 and a horizontal body portion 16. A manufacturing process may include bending the sheet metal at approximately 90° to form a right angle between the vertical body portion 14 and the horizontal body portion 16. A tab 18 may be formed on a bottom edge of the vertical body portion 14 by bending the sheet metal at approximately 90°. The tab 18 may be configured to function as a retention element for retaining the circuit board assembly 12 within the slot.

A front end 19 of the vertical body portion 14 may include a neck 20 and a head 22. The head 22 can be configured as a cap-mounting feature for supporting a plastic cap. As shown in FIG. 2, the neck 20 is configured to extend through a slit 24 in a front panel 26 of the circuit board assembly 12. A plastic cap 28 may be attached to the head 22 of the vertical body portion 14 to provide a throw that may be easy and comfortable for a user to operate. The cap 28, for instance, may include a plastic material.

When the circuit board assembly 12 is in a connected state with respect to the slot of the chassis, the tab 18 may be engaged with a locking feature attached to a frame that forms one or more slots through which the circuit board assembly 12 can be inserted. The tab 18 is configured to keep the circuit board assembly 12 secured within the slot. However, the user may wish to disengage the circuit board assembly 12 from the slot, so as to remove the circuit board assembly 12 from the slot or to simply slide the circuit board assembly 12 slightly away from the slot (e.g., for repair, testing, observation, etc.).

The horizontal body portion 16 of the latch 10 may include one or more punched and countersunk holes 30. To secure the latch 10 to the circuit board assembly 12, one or more screws or other suitable fastening elements may be used to connect the latch 10 to a bottom surface of a frame element of the circuit board assembly 12. The sheet metal may have a small thickness, such that the horizontal body portion 16 may be configured to flex enough to allow the user to lift the head 22 of the latch 10 such that the tab 18 will disengage from the locking feature of the support frame, which defines the slot, to allow the circuit board assembly to slide away from the slot.

Figure 3:
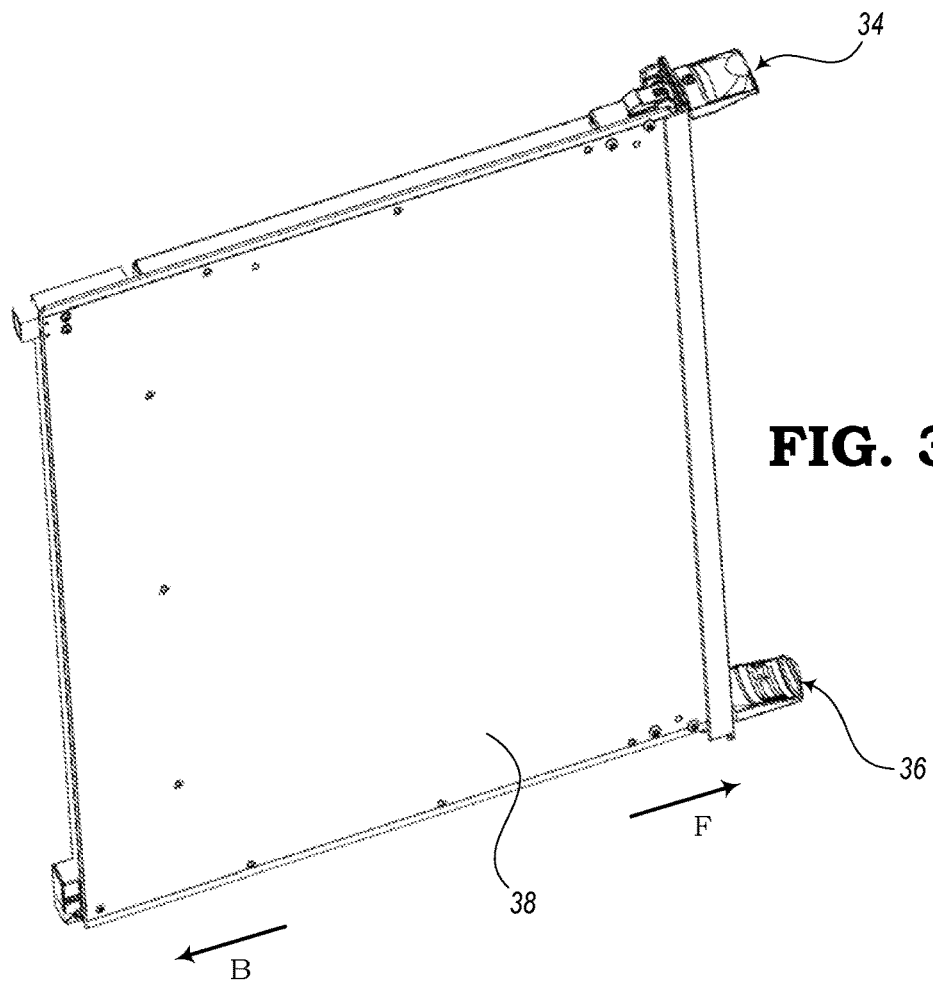
FIG. 3 is a schematic diagram illustrating a perspective view of a pair of second latches installed on a circuit board assembly for removably securing the circuit board assembly within a slot of a chassis, according to various embodiments of the present disclosure.

FIG. 3 shows a perspective view of another embodiment of latches, including a top latch 34 and a bottom latch 36 installed on a circuit board assembly 38 arranged for connection in a vertical orientation within a vertical slot of a chassis (not shown). The top latch 34 and bottom latch 36 are configured for removably securing the circuit board assembly 38 within the slot of the chassis. The top latch 34 may be configured to lock onto a top locking feature of a box-shaped frame that forms the slot and the bottom latch 36 may be configured to lock onto a bottom locking feature of the box-shaped frame. According to some embodiments, the top latch 34 and bottom latch 36 may have the same construction and may be oriented in opposite directions. To disengage the latches 34, 36 from the locking features of the box-shaped frame, a user may press upward on the top latch 34 while pressing downward on the bottom latch 36. When the latches 34, 36 are biased in this manner, the circuit board assembly 38 can be slid out of the slot of the box-shaped frame.

Figure 4:
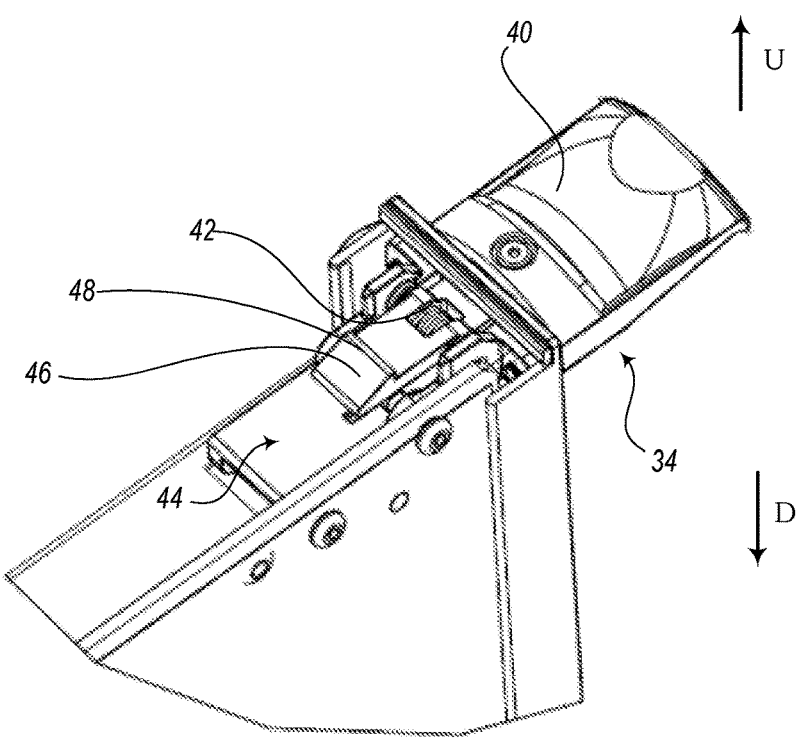
FIG. 4 is a schematic diagram illustrating a close-up perspective view of one of the second latches of FIG. 3 for showing the details of the second latches, according to various embodiments of the present disclosure.

FIG. 4 shows a close-up top perspective view of the top latch 34. It should be noted that the bottom latch 36 may include the same features as the top latch 34, and thus the view of FIG. 4 may also be considered to be a representation of a bottom perspective view of the bottom latch 36. In this embodiment, the latch 34 includes at least a lever 40 or actuator, a torsion spring 42, and a retention feature 44.

The torsion spring 42 biases the retention feature 44 in an upward direction and biases the lever 40 in a downward direction. When the circuit board assembly 38 is being installed in the slot of the chassis, the circuit board assembly 38 is slid rearward through the slot in the direction "B" shown in FIG. 3. As the circuit board assembly 38 slides rearward, a sloped portion 46 of the retention feature 44 contacts a locking edge (not shown) of the box-shaped frame, where the locking edge extends down into the slot formed by the box-shaped frame. This contact causes the retention feature 44 to be pressed downward against the upward force of the torsion spring 42 until the sloped portion 46 clears the locking edge of the box-shaped frame. At this point, the torsion spring 42 forces the retention feature 44 upward such that a front edge 48 of the retention feature 44 engages with the locking edge, thereby holding the circuit board assembly 38 within the slot. To remove the circuit board assembly 38, the user can press the lever 40 in an upward direction "U" against the force of the torsion spring 42, causing the sloped portion 46 of the retention feature 44 to drop low enough where the front edge 48 disengages from the locking edge of the slot-forming frame to free the circuit board assembly 38 from the locking edge and allow the circuit board assembly 38 to be slid forward in the "F" direction out of the slot.

The use of the torsion spring 42 in the embodiment of FIGS. 3-4 is an improvement over the metal cantilever design shown in FIGS. 1-2 since the torsion spring 42 can be designed to provide a proper amount of resistance and does not rely on the specific cross-sectional dimensions of the metal to define a reasonable amount of resistance. Also, the torsion spring 42 can be used repeatedly with little effect on the spring forces. However, the torsion spring 42 and other parts may be more costly than other designs. Also, assembly of all the parts of the latch 34 may be more complex, which may add to the manufacturing costs. Therefore, other solutions for latches in the field of telecommunications networks may be desired.

Figure 5:
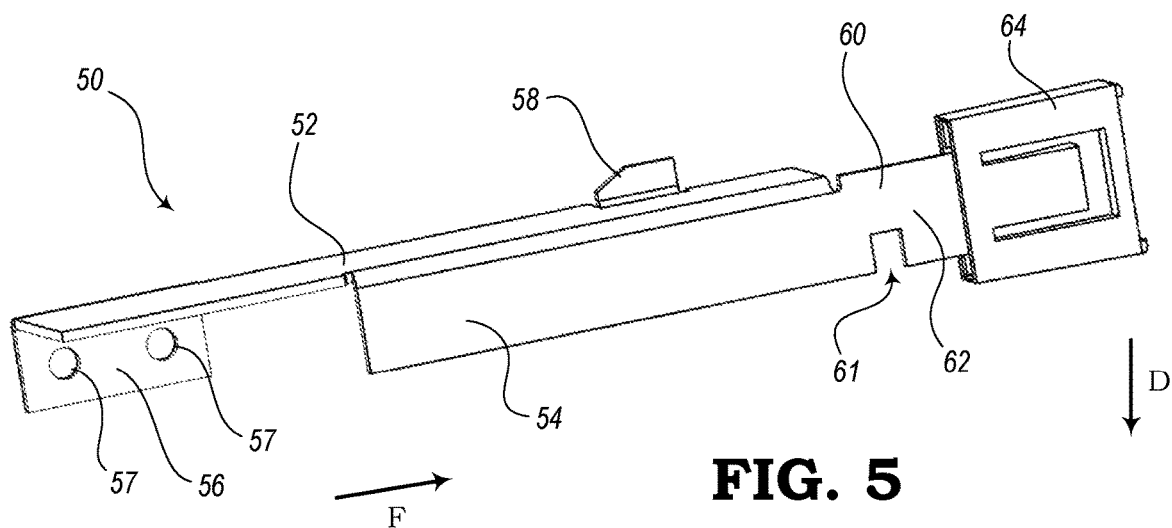
FIG. 5 is a schematic diagram illustrating a perspective view of a third latch for removably securing a circuit board assembly within a slot of a chassis, according to various embodiments of the present disclosure.

FIG. 5 shows a perspective view of a latch 50 according to another embodiment. The latch 50 is also configured for removably securing a circuit board assembly (not shown) within a slot (not shown). The latch 50 includes some similarities to the latch 10 of FIG. 1, particularly with respect to its construction. For instance, the latch 50 may be cut from a single piece of sheet metal, which is then formed, punched, etc. to achieve the final product.

The latch 50, according to the illustrated embodiment, may include a top element 52, a first side element 54, and a second side element 56. The manufacturing process may include cutting a pattern from a sheet of metal and then forming the elements 52, 54, 56 with respect to each other (e.g., at about an 90° angle) to achieve the desired shape. The second side element 56 may include mounting holes 57, which may be formed by a punching process. The mounting holes 57 may be configured to receive fastening elements (e.g., screws) for securing the latch 50 to a portion of the circuit board assembly.

The latch 50 includes a tab 58 that is formed at about 90° with respect to the top element 52. The tab 58 may be formed at a center portion of the top element 52 and is used to engage with a locking feature of a box module of a chassis, whereby the box module may form a slot through which the circuit board assembly can be inserted. Thus, the latch 50 may be configured for locking the circuit board assembly within the slot. A front portion of the first side element 54 includes a neck 60 (formed by a notch 61) and a head 62. A plastic cap 64 may be snapped onto the head 62. A user may utilize the cap 64 by pressing downward in direction "D" to disengage the tab 58 from a locking feature of the box module of the chassis, allowing the circuit board assembly to slide out of the slot of the chassis.

Figure 6:
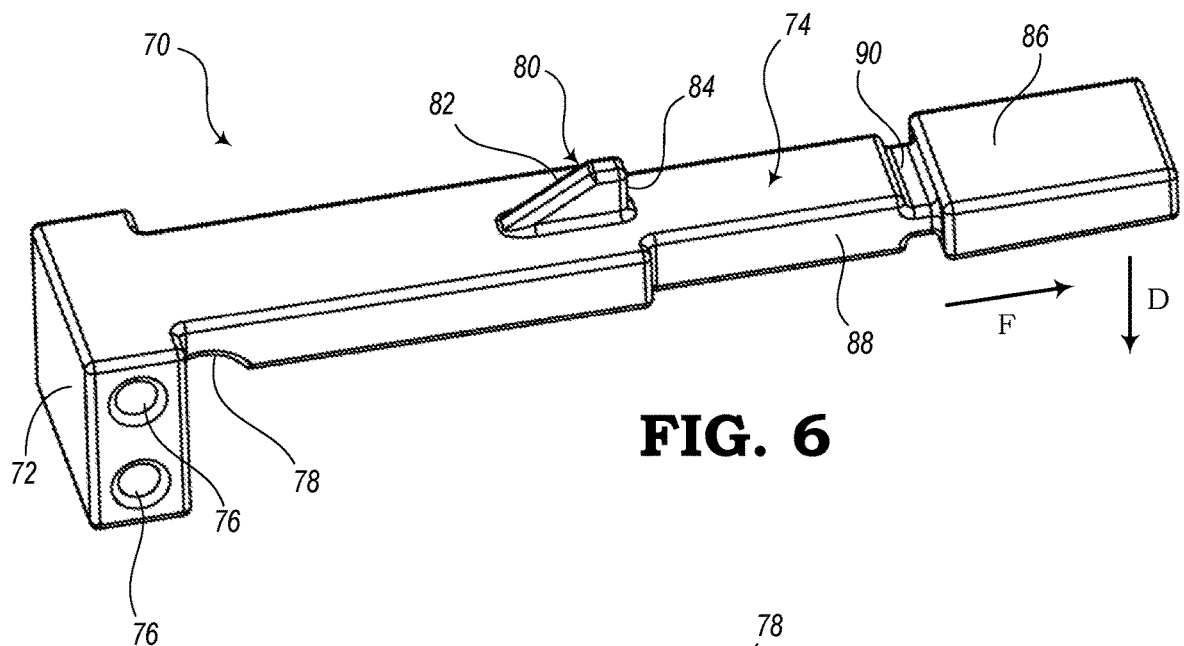
FIG. 6 is a schematic diagram illustrating a perspective view of a fourth latch for removably securing a circuit board assembly within a slot of a chassis, according to various embodiments of the present disclosure.

FIG. 6 shows a perspective view of yet another embodiment of a latch for removably securing a circuit board assembly within a slot. In this embodiment, the latch 70 may include a mounting section 72 and a cantilever section 74. The latch 70 may be manufactured in an injection molding process, whereby the mounting section 72 and cantilever section 74 may be formed as a unitary component. In some embodiments, the latch 70 may include plastic or other suitable material.

The mounting section 72 may include one or more openings 76 or mounting holes extending through the mounting section 72 in a lateral direction. The openings 76 may be configured to receive one or more screws or other types of fasteners for securing one side of the mounting section 72 to a vertically-oriented board of a circuit board assembly or other substrate for which motion is to be limited. With the mounting section 72 fixed, the cantilever section 74 may include adequate flexibility to be moved up or down without permanently deforming the latch 70. To allow the cantilever section 74 to more freely move with respect to the mounting section 72, a bridge portion 78 having a reduced width may be formed between the mounting section 72 and the cantilever section 74.

The cantilever section 74 may include a retention element 80 having a sloped portion 82 and an abutment portion 84. In operation, when a circuit board assembly on which the latch 70 is mounted is slid into a slot of a chassis, the sloped portion 82 of the retention element 80 contacts a fixed element extending from a portion of the chassis into the slot, causing the cantilever section 74 to flex downward. As the circuit board assembly continues to move farther into the slot, the retention element 80 pushes passed the fixed element of the chassis until the abutment portion 84 is adjacent to the fixed element. At this time, the cantilever section 74 is allowed to return to its normal shape and the abutment portion 84 will be engaged with the fixed element such that the circuit board assembly is secured within the slot.

However, if a user wishes to remove the circuit board assembly from the slot (or at least disengage the retention element 80 from the fixed element of the slot), the user can press down on a top surface of a lever portion 86 in direction "D" until the top of the abutment portion 84 is free to move passed the fixed element of the chassis.

The latch 70 also includes a narrow portion 88 having a narrower width than the rest of the cantilever section 74. The narrow portion 88 may be configured to be installed within a slit (not shown) of a front face of the circuit board assembly. The narrow portion 88 may be connected to the lever portion 86 by way of a neck portion 90.

In this embodiment, the latch 70 may be constructed entirely of plastic or other suitable material. The plastic material may be an improvement over the embodiments that include metal for at least the reason that plastic is usually less expensive. Another advantage is that plastic is non-conductive and does not suffer from any electrostatic discharge (ESD) or static electricity issues that may occur with metal latches. Also, metal is naturally conductive and will therefore conduct heat and electricity, which may create issues with sensitive electronic circuitry.

Furthermore, the latch 70 of FIG. 6 can be more easily designed to include particular flexibility characteristics for allowing a user to operate the latch with certain amounts of forces. Fine-tuning these characteristics can be difficult when working with metal. However, with plastic, the design process can provide the designer with more degrees of freedom in the design, whereby the metal-working processes are somewhat limited. Designing an injection molding process for the plastic latch 70 can provide greater flexibility and can be adjusted as needed to obtain adequate stiffness characteristics. However, designing with metal may be limited to typical steps such as cutting, forming, pressing, punching, and other. Not only are these metal-working processes more complex and more limited, they may also be more expensive than injection molding processes.

Figure 7:
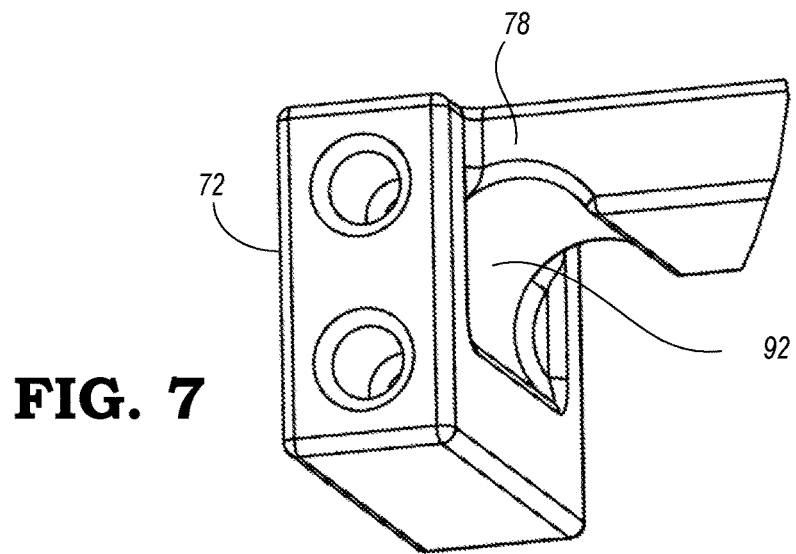
FIG. 7 is a schematic diagram illustrating a close-up perspective view of the fourth latch of FIG. 6, according to various embodiments of the present disclosure.

FIG. 7 shows a close-up perspective view of the mounting section 72 and bridge portion 78 of the latch 70 of FIG. 6. As illustrated, the bridge portion 78 includes an indentation into the mounting section 72 to form a curved feature 92. Again, the latch 70 may be created using an injection molding process, or alternatively may be created using a 3-D printing technique. However, even though the embodiment of FIGS. 6-7 provides improvements over the metal latches described above, the latch 70 may further be improved upon. For example, the cantilever section 74 of latch 70 may be constructed with too much resistance and not enough flexibility. Also, a weak point in this design may be the bridge portion 78, which has a narrow width and may not have the strength to endure repeated use. Thus, the cantilever section 74 may not be flexible enough to allow proper movement and spring return action. In use, the design of the latch 70 may experience plastic deformation that may permanently deform the cantilever section 74. Therefore, other options for designing latches may be considered.

Figure 8:
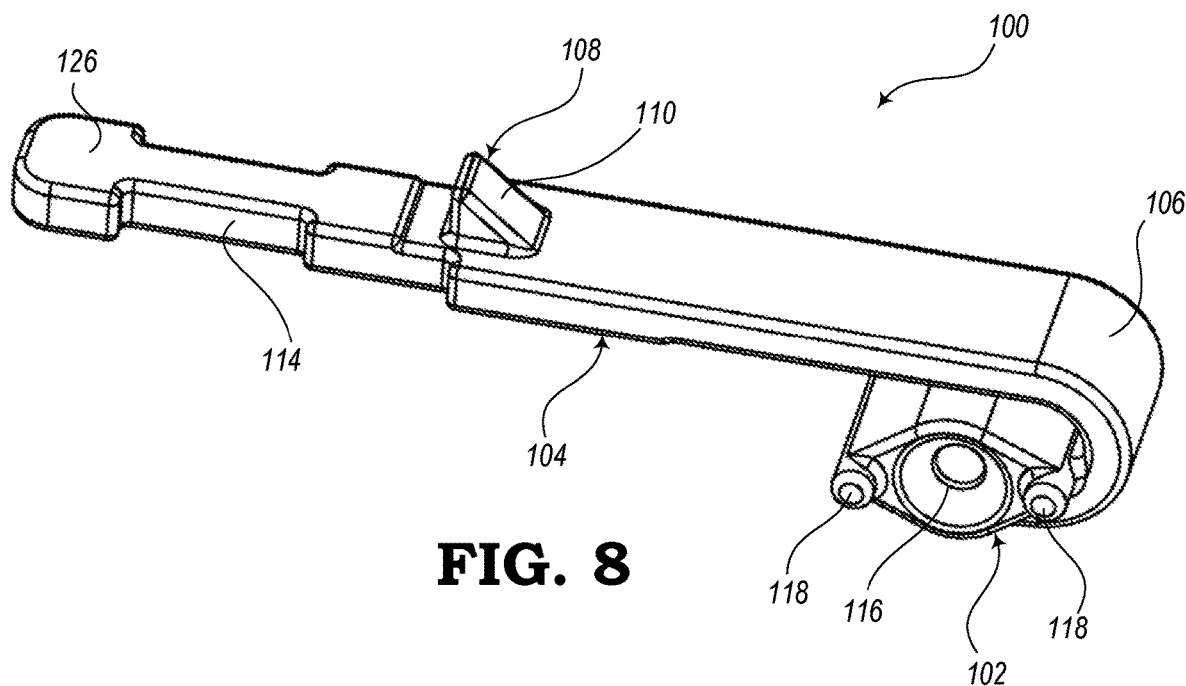
FIG. 8 is a schematic diagram illustrating a perspective view of a fifth latch for removably securing a circuit board assembly within a slot of a chassis, according to various preferred embodiments of the present disclosure.
Figure 9:
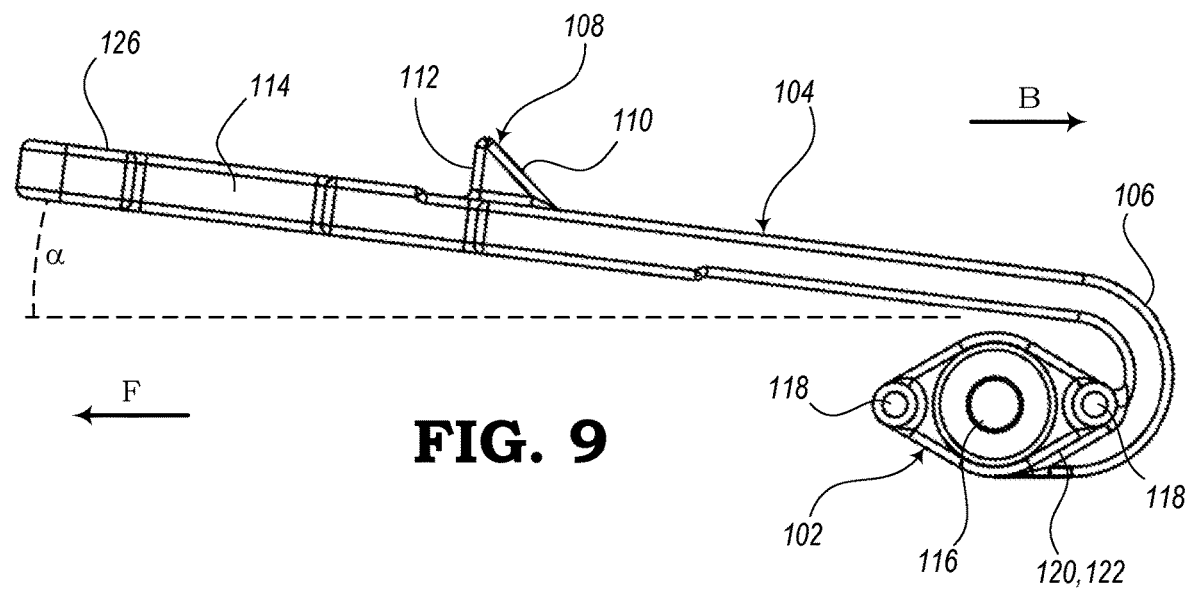
FIG. 9 is a schematic diagram illustrating a side view of the fifth latch of FIG. 8, according to various embodiments of the present disclosure.
Figure 10:
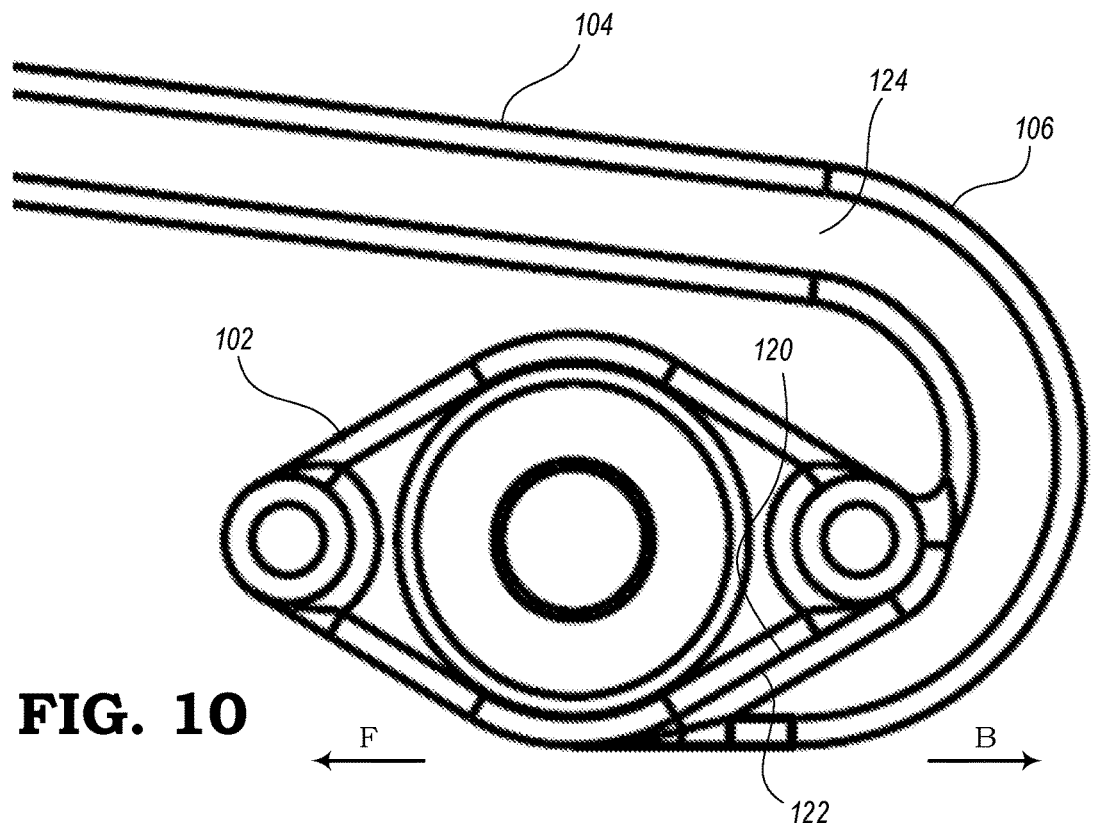
FIG. 10 is a schematic diagram illustrating a close-up side view of the fifth latch of FIG. 8, according to various embodiments of the present disclosure.
Figure 11:
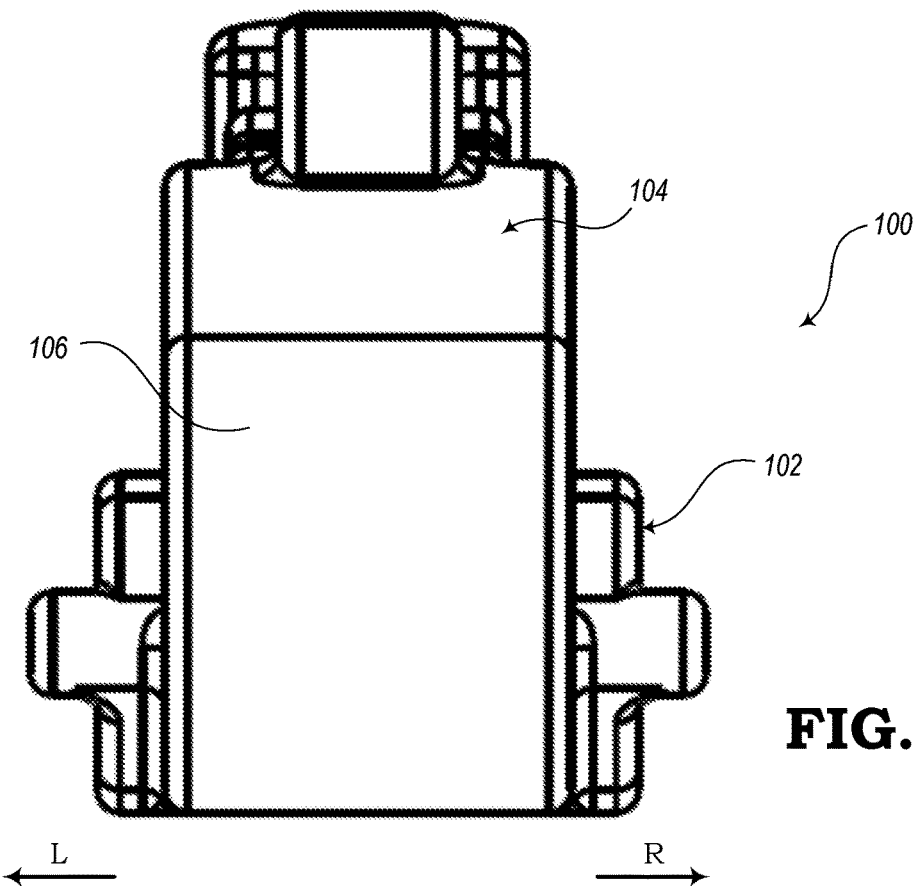
FIG. 11 is a schematic diagram illustrating a rear view of the fifth latch of FIG. 8, according to various embodiments of the present disclosure.

FIG. 8 is a perspective view showing a latch 100 according to one of the preferred embodiments of the present disclosure. In addition, FIG. 9 shows a side view of the latch 100; FIG. 10 shows a close-up side view of the latch 100; and FIG. 11 shows a rear view of the latch 100. The latch 100 may be configured for restricting motion of a substrate with respect to a fixed component or for removably securing a circuit board assembly or networking module within a slot of a chassis. The latch 100 of FIGS. 8-11 may include various improvements over the embodiments described with respect to FIGS. 1-7. In particular, the latch 100 may include a plastic spring component, which can provide the physical benefits of offering spring-action forces to allow compression in different and a tendency to return to its origin shape. Another benefit is that by being composed of plastic, the latch 100 can be manufactured as a unitary component in an injection molding manufacturing process.

For example, the latch 100 may have a different design from the steel cantilever structure described with respect to FIGS. 1 and 5 or the spring structure described with respect to FIG. 4. The latch 100 may include plastic formed in a unitary injection molding process or a 3D printing process. Since the manufacturing method and material properties of plastic injection molded parts are different than that of formed and punched metal, the embodiment of the latch 100 may be created to allow a desired amount of flexibility while also minimizing plastic deformation. In some embodiments, the design process may be adjusted to accommodate different types of circuit boards and may be further adjusted based on space limitations on the circuit boards. Therefore, the design of the embodiment of FIG. 8 may be tuned or tweaked as needed to obtain a desired spring action force, flexibility, or elasticity and/or other desired results. In particular, the latch 100 may be configured to include a large elastic displacement range. For example, in some embodiments, the elasticity of the latch 100 may be about three times greater than the elasticity of a simple cantilever structure, such as the embodiment of FIGS. 6-7.

According to various embodiments of the present disclosure, the latch 100 is configured to restrict motion of a substrate with respect to a fixed component, such as when a circuit board assembly is fully inserted within a slot of a chassis such that the latch 100 is securely engaged with the fixed component within the slot. The latch 100 may include a mounting section 102 that allows the latch 100 to be mounted to a substrate (described below with respect to FIGS. 12 and 13). The latch 100 also includes a cantilever section 104. An arc section 106 connects the mounting section 102 to the cantilever section 104. A retention component 108 extends from a surface of the cantilever section 104 and is configured to restrict motion of the substrate when engaged with the fixed component.

The arc section 106 can function as a spring-type element, whereby an external force on the cantilever section 104 (in an upward or downward direction) results in an internal stress on the arc section 106 that resists the external force. The resistive force is meant to return the latch 100 to its steady state condition with no internal stress. Because of the curvature of the arc section 106, the spring forces can be spread out along the length of the arc section 106 and can provide a consistent resistive force over a wide range of movement without causing permanent deformation of the latch 100. Also, the latch 100 can be designed such that a desired amount of force may be needed to unlock the latch 100 from the fixed element of the chassis.

The latch 100 may be further defined, whereby the substrate on which the mounting section 102 is mounted may be part of a circuit board assembly or networking module. The function of restricting motion may include restricting linear motion of the circuit board assembly with respect to a slot formed within a chassis (described below with respect to FIGS. 14 and 15). The circuit board assembly may be configured to house all or parts of a router, switch, relay, server, or other network element of a communications network. The retention component 108 may be configured to include a sloped portion 110 and an abutment portion 112. The fixed component in the chassis may be part of a box-shaped frame that defines the slot into which the circuit board assembly is inserted. The abutment portion 112 may be configured to restrict linear motion of the substrate when the abutment portion 112 is engaged with the fixed component of the box-shaped frame or chassis.

When an adequate force is applied to a surface of the cantilever section 104 to flex the cantilever section 104 with respect to the mounting section 102, the retention component 108 is configured to disengage from the fixed surface of the slot to allow the circuit board assembly to be removed from the slot. The cantilever section 104 may include a neck portion 114 where the width is reduced. The neck portion 114 of the cantilever section 104 may be configured to extend through a slit in a front panel of the circuit board assembly.

The mounting section 102, cantilever section 104, and arc section 106 may be manufactured as a unitary component in an injection molding process. The mounting section 102 may include a channel 116 extending through the mounting section 102 in a lateral or side-to-side direction. The channel 116 may be configured to receive a fastener (e.g., screw, bolt, etc.) which may be used with corresponding components (e.g., screw hole, nut, etc.) to fasten the latch 100 to the substrate of the circuit board assembly. In this respect, the substrate may be oriented in a vertical direction, but in other embodiments, the orientation of the substrate and slot may have a horizontal orientation, whereby the latch 100 may be turned on its side for connection with the horizontally-oriented substrate. The mounting section 102 may include one or more posts 118, which may also be referred to as bosses, knobs, studs, shafts, pins, etc. The posts 118 may be formed on either or both sides of the latch 100. The posts 118 may be configured to be inserted into one or more corresponding openings in the substrate to assist in mounting the latch to the substrate, whereby the one or more posts 118 may be configured to prevent rotation of the latch 100 about the channel 116.

As shown in FIG. 10, the latch 100 may be formed such that one end 120 of the arc section 106 may be connected to a bottom rear portion 122 of the mounting section 102. The arc section 106 may extend in a substantially radial direction partially around the mounting section 102, thereby forming about half of a turn of a spring element. The arc section 106 may be configured to curve more than about 90° and may be curved about 180°. In other embodiments, the arc section 106 may be configured as a spring element and may include a curve ranging from about 90° (i.e., a quarter of a turn) to about 540° (i.e., one and a half turns). According to the illustrated embodiment, which includes a turn of about 180°, the path of the latch 100 from the mounting section 102 extends first in a substantially backward direction "B" and then curves around and changes direction to extend in a substantially forward direction "F." The cantilever section 104 extends from another end 124 of the arc section 106 toward the substantially forward direction F with respect to the chassis or with respect to the substrate on which the latch 100 is mounted. Based on the forces applied to the end of the cantilever section 104, the cantilever section 104 may extend within a range from an upwardly-pointed direction slightly above a horizontal plane to a downwardly-pointed direction slightly below the horizontal plane.

The latch 100 further includes a release lever 126 (see FIGS. 8-9), or throw, that the user may use to disengage the retention component 108 from the fixed element of the chassis. For example, by pressing downward on the release lever 126, the retention component 108 may be lowered to a point where the abutment portion 112 is no longer adjacent to the fixed element. When the release lever 126 is released, the latch 100 is configured to maintain its original shape or bias upward against a top-limiting position. As such, the force of the compression of the release lever 126 results in a distributed mechanical stress (or internal elastic stress) along the entire length of the arc section 106, which can easily bend slightly to provide enough flexibility to easily push the release lever 126 when the user desires to remove the circuit board assembly from the slot. Also, since the latch 100 does not experience any permanent material deformation because of the low amounts of distributed stress on each part of the arc section 106 acting as a spring element, the latch 100 is configured to restore and retain its original shape without deformation.

Also, the latch 100 may be scalable in size and force displacement characteristics. In some embodiments, the latch 100 can be much smaller than the metal options and take up less space within the circuit board assembly or networking module or box. Since space is often an important design consideration as components and devices continue to decrease in size, the small form factor of the latch 100 may be a desirable option in many applications. For example, in one embodiment, a distance from a center of the channel 116 to a forward end of the cantilever section 104 (i.e., at the end of the release lever 126) may be about 57 mm. The entire length of the latch 100 may be about 66 mm. The distance from one post to the other may be about 10 mm. The width of the cantilever section 104 may be about 2.5 mm. It should be recognized that these dimensions are merely one example and that, according to other embodiments, the latch 100 may be larger, smaller, or include different relative sizes. The design of the latch 100 may be adjusted or tuned, based on tests of stress forces, based on look and feel, based on space limitations, or based on other factors. The tunable design may allow a designer to achieve any desirable spring-type characteristics according to various embodiments that may be conceived from an understanding of the present disclosure.

The latch 100 of FIGS. 8-11 may be easy to manufacture with respect to the other embodiments. For example, the latch 100 may comprise plastic and may be formed in an injection molding process. Also, the latch 100 may be easy to assemble onto a substrate for which motion is to be restricted. Assembly may include inserting the release lever 126 through a slit in a front panel of a circuit board assembly. Then, the latch 100 may be twisted to position the neck 114 within the slit. In some embodiments, the edges of the neck 114 and/or other parts of the cantilever section 104 may be curved for aesthetic and/or installation purposes. Next in the installation process is the act of pressing the posts 118 into corresponding holes in the substrate or circuit board. Then, a screw or other fastener can be inserted into the channel 116 to secure the latch to the circuit board.

To reiterate some of the advantages mentioned above, the latch 100 may be more cost effective than an embodiment of a latch that includes stainless steel, since plastic is normally cheaper than steel. Also, the manufacturing process for creating the latch 100 is relatively simple compared with the metal embodiments, since there are no forming, punching, or pressing steps needed with the injection molding process. Also, injection molding has fewer limitations with respect to forms that can normally be created from sheet metal. Instead, injection molding can have more degrees of freedom in the design stage than steel that is normally available only in preset sheet thicknesses. Also, since the latch 100 is manufactured in one piece, there are no separate plastic caps needed since the entire latch 100 is already made of plastic. The plastic version of the latch 100 may have a manufacturing cost of less than half the cost of the steel embodiments.

The latch 100 can therefore have tighter and more repeatable manufacturing tolerances, which can be an improvement over stainless steel, since steel might require a set up for each build and each part might be formed manually. The latch 100 can be manufactured by an injection molding technique or a 3-D printing technique in one step, instead of the multi-step process using metal and additional parts. Therefore, these techniques do not require bending, pressing, punching, or other metal-working operations.

Furthermore, the latch 100 can also have other benefits over the other embodiments. For example, when made with plastic, electrostatic discharge (ESD) issues can be minimized, since plastic is a non-conductive material. Also, the latch 100 may have the look and feel of a more expensive latch, such as one including a torsion spring.

As shown in FIGS. 8-11, the latch 100 may have symmetry with respect to a side-to-side orientation. In other words, the latch 100 can be configured to be mounted on a substrate with its right side against or adjacent to the substrate or with its left side against or adjacent to the substrate. Thus, the geometry of the latch 100 can have a symmetry, which may not be possible with a metal latch device. Also, the same latch 100 illustrated in FIGS. 8-11 can be used for latching at the front or back of the chassis and can also be used at the left or right side of the connection with the substrate within the slot. Furthermore, the latch 100 also has symmetry to allow it to be used at top and/or bottom portions of a vertically oriented box. Also, with a horizontal arrangement, the same latch can be used on both the left and right side, where the orientation of one latch may be flipped with respect to the other.

Another advantage with regard to the installation of the latch 100 is that the latch 100 may be installed with only one screw. Therefore, the latch 100 can be easy installed on the substrate or circuit board. Also, one or more posts 118 on the latch 100 can easily be inserted into corresponding holes in the circuit board during the installation of the latch 100 onto the substrate.

If a latch is needed in a circuit board assembly, there may be situations where the circuit board assembly has limited space. The latch 100 can therefore be designed with a smaller form factor to accommodate the smaller available space. The design of the latch 100 can also be tweaked to provide an acceptable resistance force when in operation. The radius of the arc section 106 can be changed if needed, as mentioned above. Also, the thickness of the material (e.g., the cantilever section 104 and/or arc section 106) can be altered in the design to achieve the desired forces. The side-to-side width can also be adjusted as needed. Furthermore, as mentioned above, the number of turns of the arc section 106 can be changed as needed. For example, the rotations may range from about ¼ of a turn (i.e., rotation) to about 1.5 turns (i.e., rotations).

Figure 12:
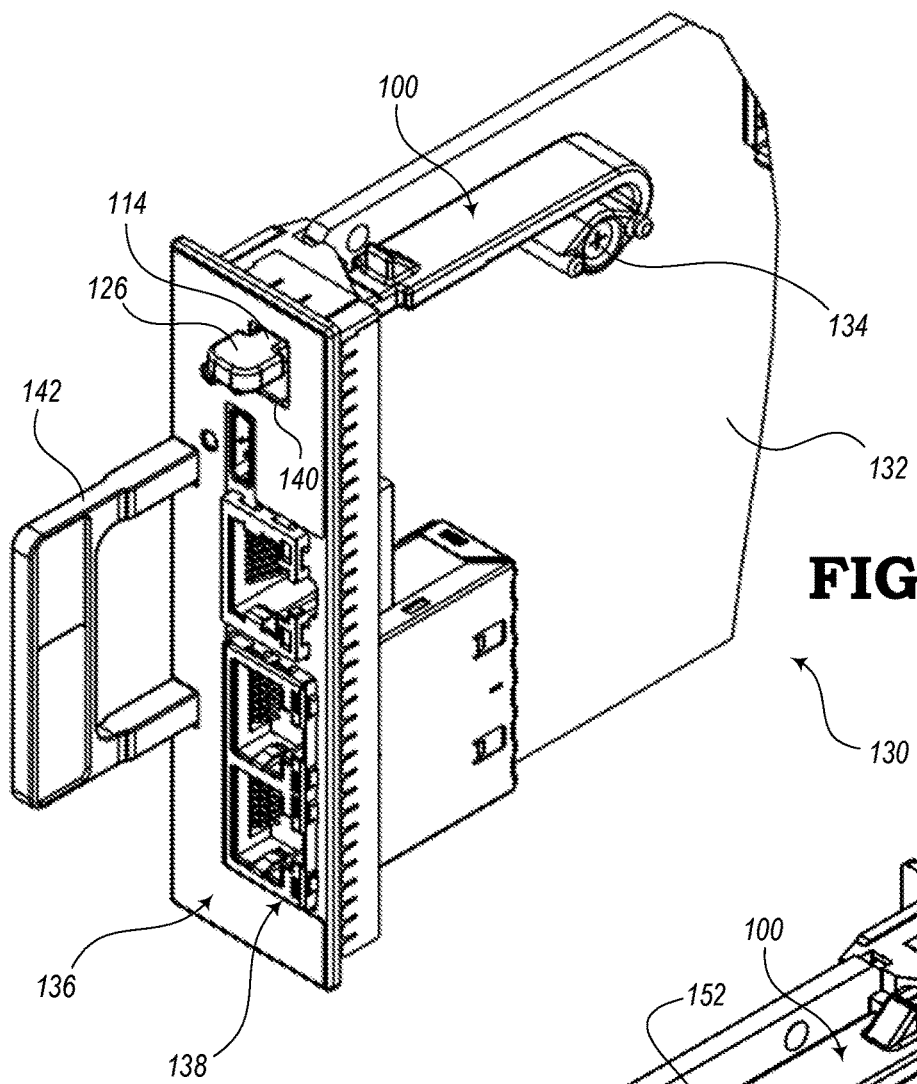
FIG. 12 is a schematic diagram illustrating a perspective view of the fifth latch of FIG. 8 installed on a circuit board assembly in a first orientation, according to various embodiments of the present disclosure.

FIG. 12 shows a perspective view of the latch 100 installed on a circuit board assembly 130 in a first orientation. In this orientation, a right side of the latch 100 (when viewed from the rear) may be mounted against, adjacent to, or near a circuit board 132 or other substrate or surface of the circuit board assembly 130. For example, in this example, a screw 134 may be used to secure the latch 100 to the circuit board 132. Network circuit elements (not shown) may be mounted on the circuit board 132.

The circuit board assembly 130 may further include a front panel 136 that is attached to the circuit board 132. The front panel 136 may include a plurality of openings therein. For example, one or more electrical and/or optical connectors 138 may be positioned within one or more openings of the front panel 136. One opening 140 in the front panel 136 may be configured to allow the release lever 126 of the latch 100 to extend outside the circuit board assembly 130 in order that a user can easily utilize the release lever 126 when needed. The neck portion 114 of the latch 100 extends through the opening 140. In addition, the front panel 136 may be configured to support a handle 142, which may be used to assist the user with sliding the circuit board assembly 130 into or out of a slot (not shown in FIG. 12).

As shown in the side view of FIG. 9, the latch 100 can be manufactured with a pre-loaded angle. Therefore, when the cantilever section 104 is installed through the front panel 136 of the circuit board assembly 130, there will be a biasing force upward against a top part of the opening 140. The pre-loaded angle provides a proper amount of resistance when a user presses down on the release lever 126. The spring action of the arc section 106 will cause the latch 100 to return to its top position. The upward force will be built-in and provide resistance from the outset. The pre-loaded angle can be adjusted in the design as needed to create the desired resistance and flexibility.

Figure 13:
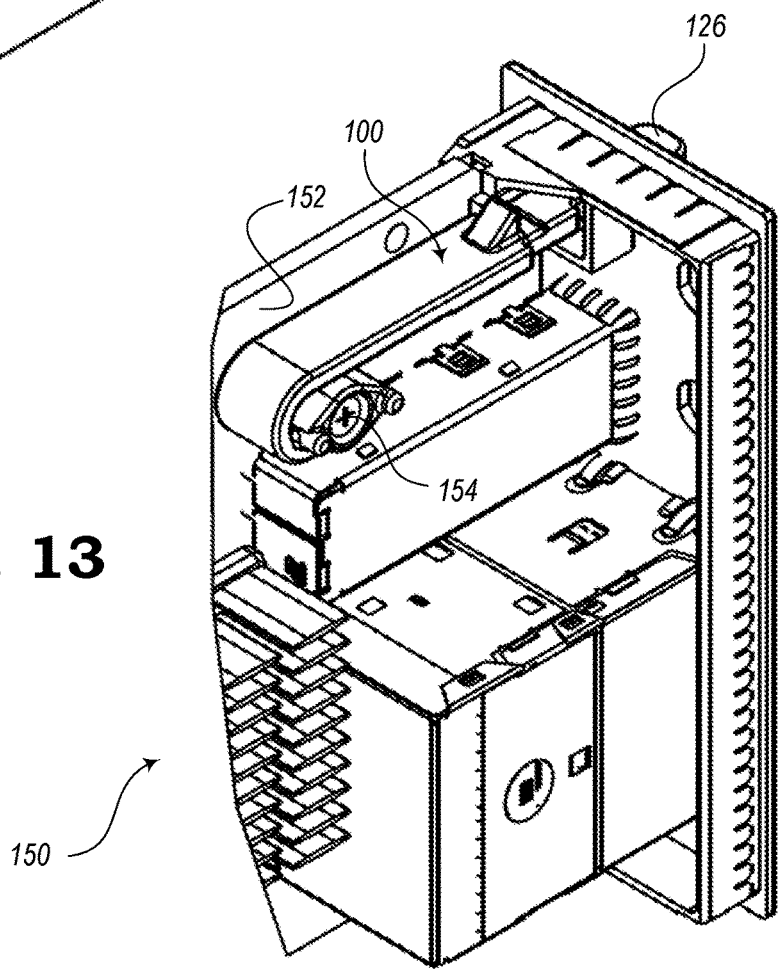
FIG. 13 is a schematic diagram illustrating a perspective view of the fifth latch of FIG. 8 installed on a circuit board assembly in a second orientation, according to various embodiments of the present disclosure.

FIG. 13 shows a perspective view of the latch 100 installed on a circuit board assembly 150 in a second orientation. In this embodiment, the same latch 100 may be connected in an opposite orientation with respect to FIG. 12, whereby a left side of the latch 100 (when viewed from the rear) is connected against, adjacent to, or near a substrate 152 of the circuit board assembly 150. In this embodiment, a screw 154 may be used to secure the latch 100 to the substrate 152.

A rear portion of the circuit board 132 or substrate of the circuit board assembly 130 of FIG. 12 and a rear portion of the circuit board 152 or substrate of the circuit board assembly 150 of FIG. 13 may include one or more electrical and/or optical connectors (not shown). These connectors, mounted on the circuit boards 132, 152 may be in electrical and/or optical communication with other networking components mounted on the circuit boards 132, 152. Also, these connectors may be removably connected with corresponding connectors on a back panel of the chassis. When the circuit board assemblies 130, 150 are inserted into one of multiple slots in the chassis, the chassis may include structural components to align the associated connectors so that the connectors can be properly connected with each other when the circuit board assemblies 130, 150 are slid into the slots.

Figure 14:
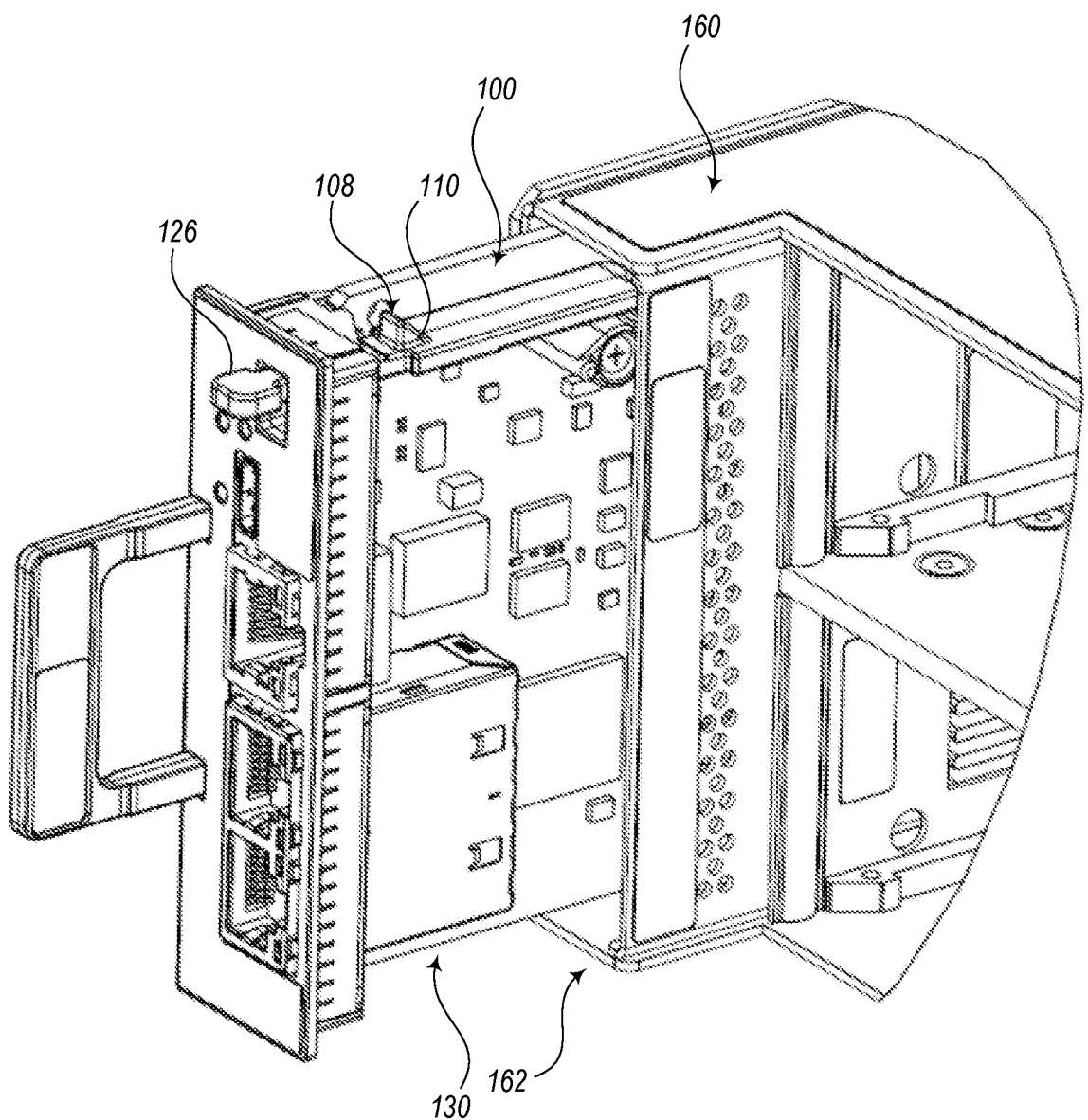
FIG. 14 is a schematic diagram illustrating a perspective view of the fifth latch of FIG. 8 installed on the circuit board assembly to be inserted in a slot of a chassis for removably securing the circuit board assembly within the slot, according to various embodiments of the present disclosure.

FIG. 14 shows a perspective view of the latch 100 that has been already been installed on the circuit board assembly 130 shown in FIG. 12. When the latch 100 is installed on the circuit board assembly 130, the latch 100 can be used to removably secure the circuit board assembly 130 within a box-shaped portion of the chassis 160. The chassis 160 as shown may include one or more slots for accepting one or more circuit board assemblies. The chassis 160 in turn may be connected to or part of a rack of a telecommunications system. The chassis 160 includes at least one slot 162 into which the circuit board assembly 130 is configured to slide. Inside the slot 162, a top portion of the chassis 160 may include a fixed element (not shown) that extends down in the path of the retention component 108 when the circuit board assembly 130 is inserted in the slot 162.

Therefore, when the circuit board assembly 130 is being inserted in the slot 162 of the chassis 160, the sloped portion 110 of the retention component 108 contacts the fixed element, causing the cantilever section 104 to be flexed downward. Deflection of the cantilever section 104 can be viewed from outside the circuit board assembly 130 by the release lever 126 correspondingly moving downward. The cantilever section 104 continues to flex slightly until the retention component 108 is passed the fixed element and the retention component 108 snaps in behind the fixed element inside the slot 162 of the chassis 160.

Figure 15:
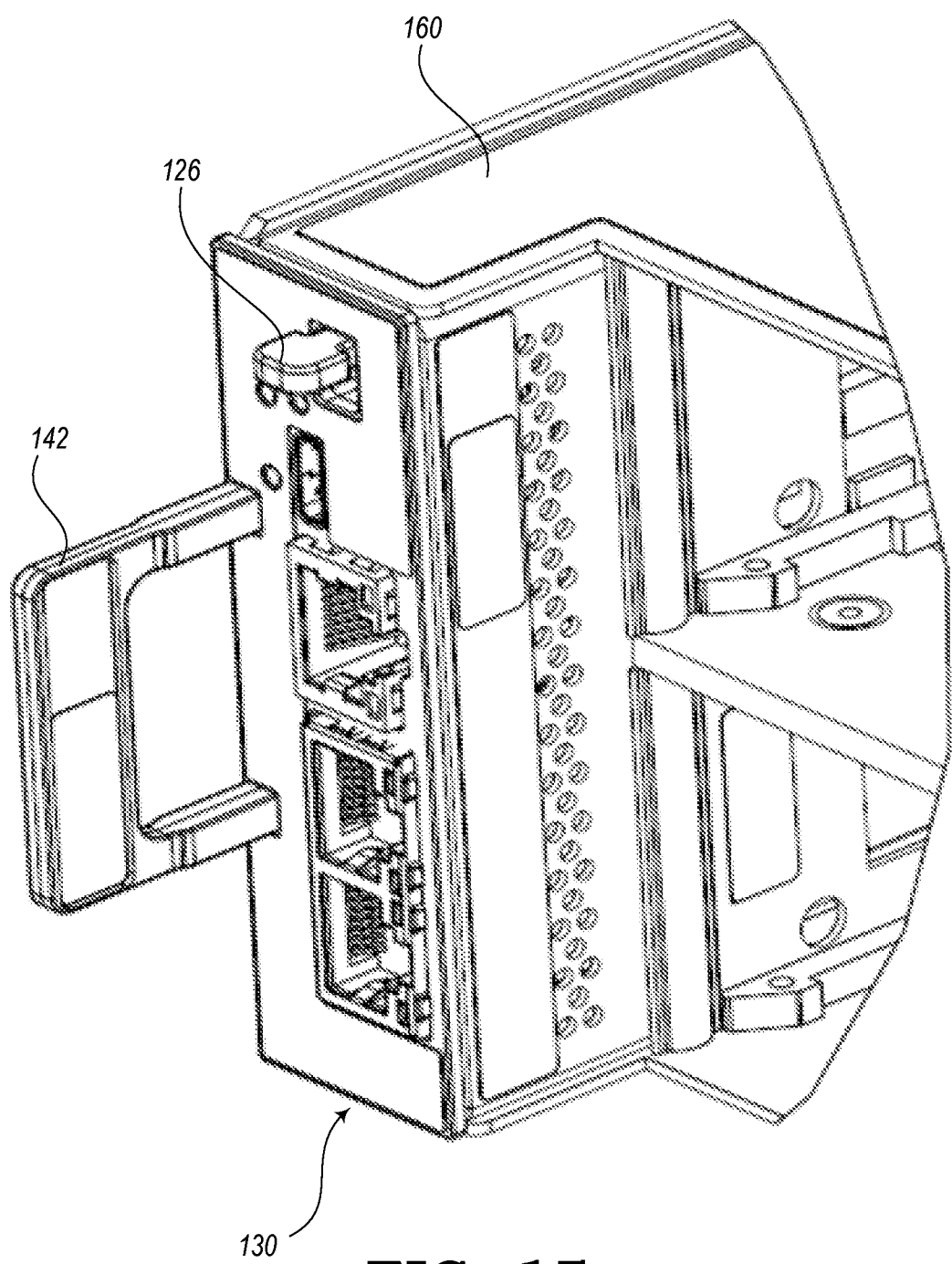
FIG. 15 is a schematic diagram illustrating a perspective view of an exposed portion (e.g., the release lever) of the fifth latch of FIG. 8 in a securely installed state within the chassis, according to various embodiments of the present disclosure.

FIG. 15 illustrates a perspective view of the circuit board assembly 130 being completely inserted into the slot 162 (blocked from view in FIG. 15) of the slot of the chassis 160. To remove the circuit board assembly 130 from the chassis 160, a user can press down on the release lever 126 and pull on the handle 142. With the release lever 126 pressed, thereby unlocking the latch 100, the retention component 108 (blocked from view) of the latch 100 will be moved out of the way of the fixed element that securely extends down from the top inner surface of the box frame of the chassis 160. When disengaged, the circuit board assembly 130 can be removed from the chassis 160.

Figure 16:
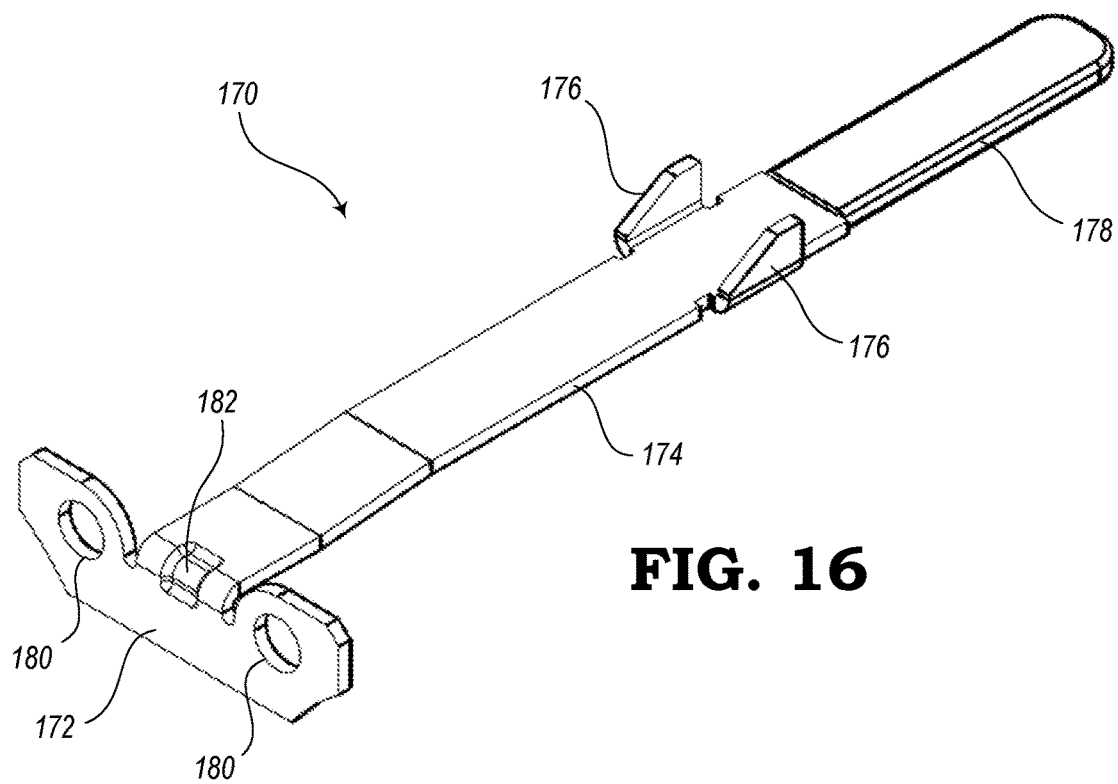
FIG. 16 is a schematic diagram illustrating a perspective view of a sixth latch for removably securing a circuit board assembly within a slot of a chassis.

FIG. 16 shows a perspective view of a latch 170 that may be used for removably securing a circuit board assembly within a slot. However, as opposed to the embodiments described above in which the mounting components are used for mounting the respective latches in a side-to-side arrangement for securing the latches to a front-to-back substrate, the latch 170 of FIG. 16 include a front-to-back oriented mounting element 172. The latch 170 may be manufactured from sheet metal that is cut to a specific design and then folded at various places. Then, the front end of the latch 170 can be treated to provide a suitable handle or tab for the user's comfort and to reduce ESD.

The latch 170 includes the mounting element 172 which may be angle at about 90° with respect to a cantilever element 174. The cantilever element 174 may include one or more retention elements 176 that are bent with respect to the cantilever element 174 at an angle of about 90°. An activation lever 178, or release lever or tab, is formed at the end of the cantilever element 174. The activation lever 178 may be coated with a rubber or plastic material or may include a plastisol-dipped ESD cap applied in a secondary operation after manufacture of the metal part.

At the bend between the mounting element 172 and the cantilever element 174, a stiffening embossed portion 182 may be created by an embossing step. The mounting element 172 may include one or more openings 180, such as mounting screw holes. One or more fasteners (e.g., screws) may be used to secure the latch 170 to a back section of a side-to-side element included on a circuit board assembly or networking module.

Figure 17:
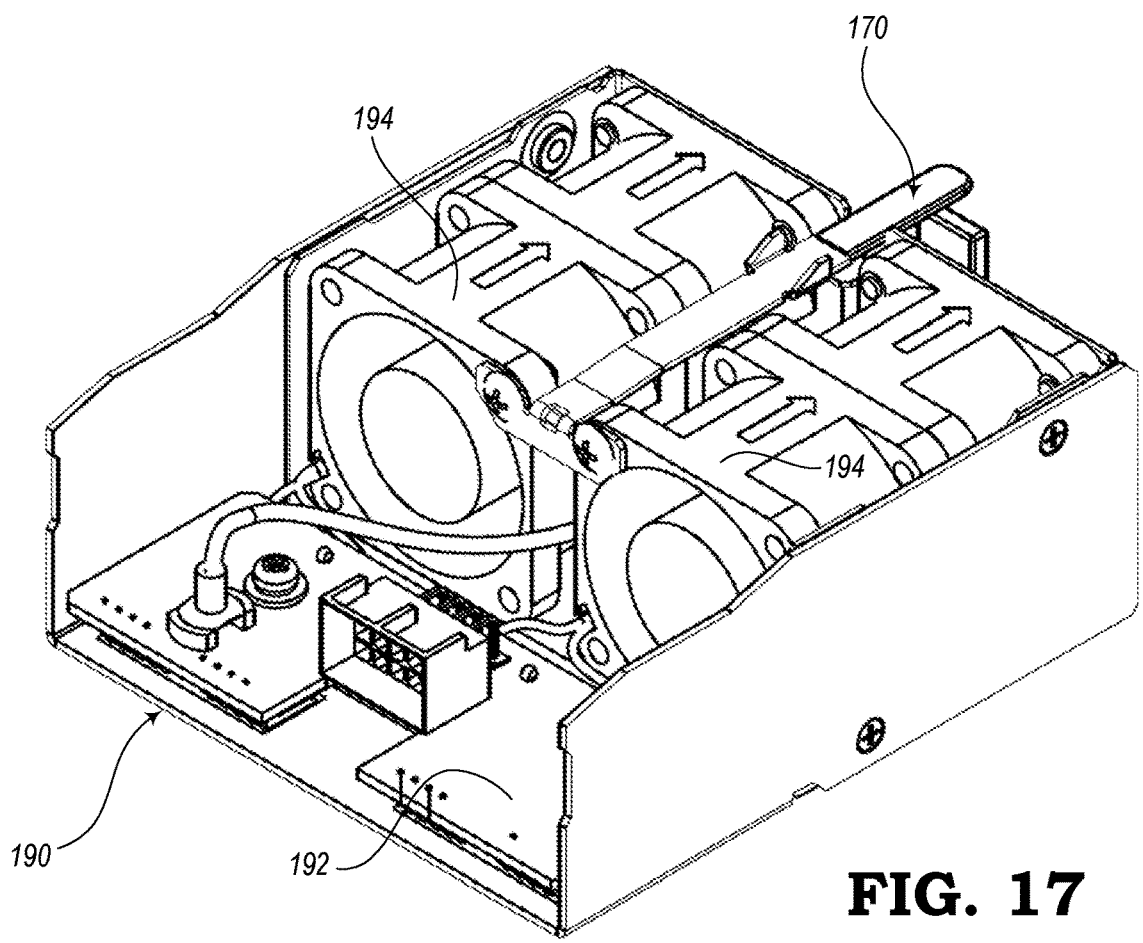
FIG. 17 is a schematic diagram illustrating a perspective view of the sixth latch of FIG. 16 installed on a fan housing of a circuit board assembly for removably securing the circuit board assembly within a slot of a chassis.

FIG. 17 shows a perspective view of the latch 170 installed on a circuit board assembly 190 or networking module arranged in a horizontal orientation. The circuit board assembly 190 may have a pizza box configuration or other flat arrangement where a supporting substrate 192 is positioned horizontally. Instead of connecting the latch 170 directly to the supporting substrate 192, as is done with the embodiments described above, the latch 170 is configured to be connected to the surfaces of one or more components that substantially forms a plane having a first axis in a side-to-side direction and a second axis in a top-to-bottom direction, whereby the plane may be substantially orthogonal to an axis in a front-to-back direction.

For instance, in this orthogonal plane, one or more fan housings 194 may be mounted on the supporting substrate 192 of the circuit board assembly 190. As such, the activation lever 178 of the latch 170 may extend forward beyond a front surface of the circuit board assembly 190. The latch 170 may be configured for removably securing the circuit board assembly 190 within a slot (not shown) that is similarly arranged in a horizontally oriented manner.

FIG. 18 is a schematic diagram showing a perspective view of a latch 200 according to yet another embodiment for removably securing a circuit board assembly within a slot. FIG. 19 shows a close-up perspective view of the latch 200. In addition to the embodiment of the latch 100 shown in FIGS. 8-11, the latch 200 may also be considered to be a preferred embodiment with respect to the other embodiments describe in the present disclosure. The latch 200 is similar to the latch 100 in that the latch 200 can also be constructed in an injection molding process (the same as or similar to the manner in which the latch 100 is constructed) to create a unitary structure, such as one comprising plastic or other suitable material. The latch 200 is similar to the latch 170 shown in FIG. 16 in that the latch 200 can be configured to be mounted to surfaces of components mounted on a substrate of a circuit board assembly and not necessarily mounted on the substrate itself.

The latch 200 may be configured to include a mounting element 202, an arc element 204, and a cantilever element 206. It should be noted that the arc element 204 and cantilever element 206 of the latch 200 may be the same as or similar to the arc section 106 and cantilever section 104 of the latch 100 of FIG. 8. Also, the latch 200 may be constructed using the same or similar plastic injection molding process as described above with respect to the latch 100. The mounting element 202 may include a body portion 208 and a planar portion 210. The planar portion 210 may be configured as a panel formed in a plane that is configured to be parallel with a surface or surfaces of components supported within the circuit board assembly. In other words, the planar portion 210 is configured to extend in a side-to-side direction. The planar portion 210 may include a plurality of openings 212, such as bore holes, configured to allow the latch 200 to be mounted to the surface or surfaces of the components of the circuit board assembly. The openings 212 are configured to receive fasteners for fastening the latch 200 to a rear section of a fan housing or other component of a circuit board assembly to be secured with a slot of a chassis.

The latch 200 further includes a retention element 214 extending from a top surface of the cantilever element 206. The retention element 214 includes a sloped portion 216 that contacts a fixed element of a box module when a circuit board assembly, on which the latch 200 is mounted, is inserted into the slot of the chassis.

FIG. 20 shows a perspective view of the latch 200 attached to components installed on a substrate 220 of a circuit board assembly 222. In this example, the latch 200 is attached to the back of one or more fan housings 224 of multiple fans mounted on the substrate 220 of the circuit board assembly 222. The latch 200 is configured for removably securing the circuit board assembly 222 within a slot (not shown).

Although exemplary embodiments are illustrated in the figures and described above, it should be understood that the principles of the present disclosure may be implemented using any number of techniques and are not limited to the exemplary embodiments and implementations. Also, elements depicted in the drawings are not necessarily drawn to scale. Modifications, additions, or omissions may be made to the systems, apparatuses, and methods described herein without departing from the spirit and scope of the present disclosure. For example, the components of the systems and apparatuses may be integrated or separated. Moreover, the operations of the systems and apparatuses disclosed herein may be performed by more, fewer, or other components and the methods described may include more, fewer, or other steps.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A networking module comprising:
a substrate; and
a latch for restricting motion of the substrate with respect to a fixed component, wherein the latch includes
a mounting section configured for mounting the latch to the substrate,
a cantilever section,
an arc section connecting the mounting section to the cantilever section, and
a retention component extending from a surface of the cantilever section, the retention component configured to restrict motion of the substrate when engaged with the fixed component.

2. The networking module of claim 1, wherein the substrate is configured to be inserted within a slot of a chassis, and wherein the fixed component is arranged within the chassis.

3. The networking module of claim 2, wherein the substrate is part of a circuit board assembly, and wherein restricting motion includes restricting linear motion of the circuit board assembly with respect to the slot of the chassis.

4. The networking module of claim 2, wherein the retention component of the latch includes a sloped portion and an abutment portion, and wherein the abutment portion is configured to restrict linear motion of the substrate when the abutment portion is engaged with the fixed component.

5. The networking module of claim 4, wherein, when an adequate force is applied to a surface of the cantilever section of the latch to flex the cantilever section with respect to the mounting section, the retention component is configured to disengage from the fixed component to allow the circuit board assembly to be removed from the slot.

6. The networking module of claim 1, wherein the mounting section of the latch includes a channel extending through the mounting section in a side-to-side direction, the channel configured to receive a fastener configured to fasten the latch to the substrate.

7. The networking module of claim 6, wherein the mounting section of the latch includes one or more posts configured to be inserted into one or more corresponding openings in the substrate for mounting the latch to the substrate, the one or more posts configured to prevent rotation of the latch about the channel.

8. The networking module of claim 1, wherein one end of the arc section is connected to a bottom rear portion of the mounting section and extends in a substantially radial direction partially around the mounting section.

9. The networking module of claim 8, wherein the arc section curves more than 90° and the cantilever section extends from another end of the arc section toward a forward direction with respect to the substrate.

10. The networking module of claim 1, wherein the latch has symmetry in at least a side-to-side orientation.

11. The networking module of claim 1, further comprising a frame configured to house at least the substrate and further configured to house a router, switch, or server of a communications network.

12. The networking module of claim 11, wherein the cantilever section of the latch includes a neck portion where the width is reduced, the neck portion of the cantilever section configured to extend through a slit in a front panel of the frame.

13. A chassis configured to receive a circuit board assembly of a communications network, the chassis comprising:
a slot into which the circuit board assembly is configured to be inserted, the circuit board assembly including at least a planar substrate; and
a fixed component arranged within the slot;
wherein a latch is connected to the planar substrate of the circuit board assembly to restrict motion of the planar substrate with respect to the fixed component; and wherein the latch includes
- a mounting section allowing the latch to be mounted to the planar substrate,
- a cantilever section,
- an arc section connecting the mounting section to the cantilever section, and
- a retention component extending from a surface of the cantilever section, the retention component configured to restrict motion of the planar substrate when engaged with the fixed component.

14. The chassis of claim 13, wherein the retention component of the latch includes a sloped portion and an abutment portion configured to restrict linear motion of the planar substrate when the abutment portion is engaged with the fixed component, and wherein, when an adequate force is applied to a surface of the cantilever section to flex the cantilever section with respect to the mounting section, the retention component is configured to disengage from the fixed component to allow the circuit board assembly to be removed from the slot.

15. The chassis of claim 13, wherein the mounting section includes a channel extending in a lateral direction therethrough, wherein the channel is configured to receive a fastener configured to fasten the latch to the planar substrate, and wherein the mounting section further includes one or more posts configured to be inserted into one or more corresponding openings in the planar substrate for mounting the latch to the planar substrate, the one or more posts configured to prevent rotation of the latch about the channel.

16. A latch for securing a circuit board assembly within a slot of a telecommunications chassis, the latch comprising:
- a mounting section allowing the latch to be mounted to the circuit board assembly;
- a cantilever section;
- an arc section connecting the mounting section to the cantilever section; and
- a retention component extending from a surface of the cantilever section, the retention component configured to restrict linear motion of the circuit board assembly when engaged with a fixed component within the slot of the telecommunications chassis.

17. The latch of claim 16, wherein the circuit board assembly is configured as a router, switch, or server of a telecommunications network, and wherein the latch includes symmetry to allow the latch to be mounted to the circuit board assembly in either a left-side orientation or a right-side orientation.

18. The latch of claim 16, wherein one end of the arc section is connected to a bottom rear portion of the mounting section and extends in a substantially radial direction partially around the mounting section, wherein the arc section curves more than 90 degrees, and wherein the cantilever section extends from another end of the arc section in a substantially forward direction with respect to the telecommunications chassis.

19. The latch of claim 16, wherein the mounting section, cantilever section, and arc section are manufactured as a unitary component in an injection molding process.

* * * * *